US010225921B2

(12) United States Patent
Lasagni (10) Patent No.: US 10,225,921 B2
(45) Date of Patent: Mar. 5, 2019

(54) PROCEDURE FOR THE MANUFACTURE AND ASSEMBLY OF ELECTRONIC BOARDS AND ELECTRONIC DEVICE THUS OBTAINABLE

(71) Applicant: META SYSTEM S.P.A., Reggio Emilia (IT)

(72) Inventor: Cesare Lasagni, Reggio Emilia (IT)

(73) Assignee: META SYSTEM S.P.A., Reggio Emilia (IT)

( * ) Notice: Subject to any disclaimer, the term of this patent is extended or adjusted under 35 U.S.C. 154(b) by 89 days.

(21) Appl. No.: 14/653,658

(22) PCT Filed: Dec. 12, 2013

(86) PCT No.: PCT/IB2013/060837
§ 371 (c)(1),
(2) Date: Jun. 18, 2015

(87) PCT Pub. No.: WO2014/097061
PCT Pub. Date: Jun. 26, 2014

(65) Prior Publication Data
US 2015/0351226 A1      Dec. 3, 2015

(30) Foreign Application Priority Data

Dec. 21, 2012   (IT) .............................. MO2012A0321

(51) Int. Cl.
*H05K 1/02*      (2006.01)
*H05K 1/14*      (2006.01)
(Continued)

(52) U.S. Cl.
CPC ........... *H05K 1/0213* (2013.01); *H05K 1/142* (2013.01); *H05K 1/144* (2013.01); *H05K 1/181* (2013.01);
(Continued)

(58) Field of Classification Search
CPC ...... H05K 1/0213; H05K 1/142; H05K 1/144; H05K 1/181; H05K 2201/042;
(Continued)

(56) References Cited

U.S. PATENT DOCUMENTS 5,249,973 A     10/1993   Fujita et al.
9,035,597 B2 *   5/2015   Sharaf .................... H05K 7/209
                                                         320/107
(Continued)

FOREIGN PATENT DOCUMENTS

EP       0 825 680 A2    2/1998

OTHER PUBLICATIONS

International Search Report dated Apr. 2, 2014, in corresponding PCT application.

*Primary Examiner* — Peter DungBa Vo
*Assistant Examiner* — Azm Parvez
(74) *Attorney, Agent, or Firm* — Young & Thompson (57) ABSTRACT

The procedure for the manufacture and assembly of electronic boards includes the steps of:
  arranging a first electronic board (2) having a first power connector (7) of substantially elongated shape;
  arranging a second electronic board (10) having a through opening (14) suitable for allowing the passage of the first power connector (7);
  arranging a third electronic board (15) including a power circuit and having a second power connector (18) which can be connected to the first power connector (7);
  associating the second electronic board (10) with the first electronic board (2), wherein the step of associating includes inserting the first power connector (7) through the through opening (14);
  associating the third electronic board (15) with the second electronic board (10), wherein the step of associating
(Continued)

includes connecting the second power connector (18) to the first power connector (7).

5 Claims, 6 Drawing Sheets

(51) Int. Cl.
  *H05K 1/18* (2006.01)
  *H05K 3/30* (2006.01)
  *H05K 3/36* (2006.01)

(52) U.S. Cl.
  CPC ............... *H05K 3/30* (2013.01); *H05K 3/368* (2013.01); *H05K 1/0263* (2013.01); *H05K 3/305* (2013.01); *H05K 2201/042* (2013.01); *H05K 2201/09063* (2013.01); *H05K 2201/10189* (2013.01); *Y10T 29/49128* (2015.01)

(58) Field of Classification Search
  CPC .......... H05K 2201/09063; H05K 2201/10189; H05K 3/30; H05K 3/368; H05K 3/305; Y10T 29/49128
  USPC .................. 29/830, 829, 825, 592.1, 832
  See application file for complete search history.

(56) References Cited

U.S. PATENT DOCUMENTS

| | | | |
|---|---|---|---|
| 2002/0168882 A1* | 11/2002 | Chiriku | H01R 9/2466 439/76.2 |
| 2007/0020968 A1 | 1/2007 | Oka | |
| 2008/0268671 A1* | 10/2008 | Harris | H01H 85/046 439/76.2 |
| 2011/0310585 A1* | 12/2011 | Suwa | H05K 7/20927 361/820 |
| 2012/0161558 A1* | 6/2012 | Yamasaki | H02K 11/33 310/71 |
| 2012/0235290 A1* | 9/2012 | Morelle | H01L 23/36 257/684 |

\* cited by examiner

PROCEDURE FOR THE MANUFACTURE AND ASSEMBLY OF ELECTRONIC BOARDS AND ELECTRONIC DEVICE THUS OBTAINABLE

TECHNICAL FIELD

The present invention relates to a procedure for the manufacture and assembly of electronic boards and to an electronic device thus obtainable.

BACKGROUND ART

With reference to the electric and electronic sector, the manufacture is known of electronic devices consisting of several electronic boards suitably connected and assembled together on several levels.

In particular, the use is known and widespread of one or more distinct electronic boards dedicated to the electric control circuit and to the electric power circuit. In particular, in case of the separation of the control circuit from the power circuit, greater safety can be obtained for any operator working on the electronic boards.

In fact, the control circuit can this way work at a reduced safety voltage compared to the power circuit.

Generally speaking, the connection between the control logics of two electronic boards adjacent to one another is made by means of special control connectors, consisting e.g. of male and female DIN connectors which can be coupled together to permit the transmission of control signals.

Furthermore, the connection between electronic power circuits of two electronic boards adjacent to one another is done by means of special power connectors consisting e.g. of so-called "faston" connectors of the male and female type which can be coupled together to permit the passage of the power signal.

To electrically connect two boards that are not adjacent to one another instead, suitable connectors must be used, suitably fixed along respective perimeter portions of the electronic boards, connected together by means of a series of specific cables.

The result, therefore, is a series of cables extending outside the group of electronic boards, able to suitably connect all those boards not directly adjacent to one another.

The above procedures and devices of known type do however have a number of drawbacks.

In particular, the need to connect the electronic boards not directly adjacent to one another by means of a plurality of cables inevitably involves an increase in the complexity of the assembly procedure, as well as an extension of the total time required to complete the assembly itself.

Furthermore, the need to connect the electronic boards not directly adjacent to one another by means of a plurality of cables inevitably results in the greater possibility of connection errors occurring and, consequently, makes necessary the use of specific documentation suitable for guiding the operator during assembly and the electrical connection of the boards and/or the use of connectors of different type/colour so as to limit the possibility of errors.

A further limit is the fact that the use of connectors arranged in correspondence to one or more sections of the perimeter of the electronic boards inevitably results in a layout of the boards suitably studied to accommodate such connectors, with suitable spaces on the printed circuits dedicated to the connectors themselves.

The use of the cables, furthermore, in many cases involves the realization of excessively long paths, with the consequent generation of disturbances on the power signals.

DESCRIPTION OF THE INVENTION

The main aim of the present invention is to provide a procedure for the manufacture and assembly of electronic boards and an electronic device thus obtainable which permit simplifying and speeding up the assembly and electrical connection of the electronic boards.

Another object of the present invention is to provide a procedure for the manufacture and assembly of electronic boards and an electronic device thus obtainable which permit reducing errors during the assembly procedure of the electronic boards.

Another object of the present invention is to provide a procedure for the manufacture and assembly of electronic boards and an electronic device thus obtainable which permit reducing the overall dimensions of the electronic boards and, therefore, of the manufactured electronic device.

Another object of the present invention is to provide a procedure for the manufacture and assembly of electronic boards and an electronic device thus obtainable which permit overcoming the mentioned drawbacks of the state of the art within the ambit of a simple, rational, easy, effective to use and low cost solution.

The above objects are achieved by the present procedure for the manufacture and assembly of electronic boards according to claim 1.

The above object are also achieved by the present electronic device according to claim 9.

BRIEF DESCRIPTION OF THE DRAWINGS

Other characteristics and advantages of the present invention will become more evident from the description of a preferred, but not sole, embodiment of a procedure for the manufacture and assembly of electronic boards and of an electronic device thus obtainable, illustrated purely as an example but not limited to the annexed drawings in which.

EMBODIMENTS OF THE INVENTION

With particular reference to such figures, globally indicated by 1 is an electronic device which can be made by means of the procedure according to the invention.

In particular, the procedure and the device thus obtainable allow considerably simplifying and speeding up the procedure of assembly and electrical connection between several overlapped electronic boards.

In actual facts, according to the present solution, it is sufficient to insert the electronic boards one on top of the other to connect electronically all the connectors, in an extremely easy and fast way.

Therefore, in a way different to the state of the art, by means of the proposed solution it is unnecessary to electrically connect two boards not adjacent to one another by means of connectors fixed along respective perimeter portions of the electronic boards, connected together by means of a series of specific external cables.

Furthermore, the proposed solution permit considerably limiting errors during the procedure of assembly and electronic connection of the electronic boards and considerably reducing the overall dimensions of the electronic boards and, therefore, of the electronic device obtained.

The device 1 shown in the illustrations is composed of a battery charger for vehicles, usable in particular to recharge the batteries of electric vehicles.

Consequently, the device 1 is composed of a suitable electric circuit connectable to the battery of an electric vehicle and suitable for recharging the battery itself. The manufacture of electronic devices of different type cannot however be ruled out.

With reference to the embodiment shown in the illustrations, the device 1 comprises a first electronic board 2 comprising:
- a first printed circuit 3;
- a plurality of electronic components 4 suitable for processing power supply voltages and currents and consisting, e.g., of electronic power components, condensers or the like;
- a plurality of wound components 5 consisting, e.g., of components such as transformers, filters and inductances.

In particular, the wound components 5 are large-size components usable for powers in the kW range.

The electronic components 4 and the wound components 5 are fixed to the first printed circuit 3 and are electronically connected to the conductive tracks of the printed circuit itself.

Advantageously, the first electronic board 2 comprises one or more first control connectors 6 and one or more first power connectors 7.

In particular, it is pointed out that in the present description, by the expression "control connector" is meant an electronic connector usable for sending control signals (therefore reduced voltage/current signals).

Furthermore, it is pointed out that in the present description, by the expression "power connector" is meant an electronic connector usable for conducting power signals (therefore high voltage/current signals).

The electronic board 2 also has a template 8 fastened to the first printed circuit 3 and having a perimeter retention wall which surrounds the portion of the printed circuit on which the wound components 5 are fixed.

Usefully, the electronic board 2 comprises a layer of solidified thermo-hardening material 9 deposited on the entire area of the printed circuit 3 delimited by the template 8 and suitable for allowing the wound components 5 to be locked on the printed circuit itself.

Advantageously, a layer of solidified thermo-hardening material 9 can be deposited on an area of the first printed circuit 3 in correspondence to the first control connectors 6 and to the first power connectors 7 to allow locking the connectors to the printed circuit itself.

In practice therefore, the layer of solidified thermo-hardening material 9 permits achieving a greater mechanical sturdiness of the electronic board, ensuring the locking of the first control connectors 6 and, in particular, of the first power connectors 7 directly on the first printed circuit 3.

Usefully, the layer of thermo-hardening material 9 also permits a uniform and efficient dispersion of the heat produced by the wound components 5 during normal operation.

Usefully, the thermo-hardening material 9 can be made of a resin or a similar material.

The first printed circuit 3 can be made by means of techniques of known type on a support in dielectric material, of the vetronite type or other similar electrically-insulating material.

Alternatively, one embodiment of the device 1 can envisage the realization and use of a printed circuit of the IMS (Insulated Metal Substrate) type.

In this case, therefore, the first printed circuit 3 comprises a support in metal material, preferably aluminium, on which is deposited a dielectric layer.

The device 1 also has a second electronic board 10 comprising a second printed circuit 11 and a plurality of electronic components 12 connected together on the printed circuit 11 to make up a control circuit.

The second electronic board 10 comprises second control connectors 13 connected to the first control connectors 6 and suitable for transmitting control signals from/to the first electronic board 2.

In particular, each first control connector 6 can be made, e.g., of three pairs of metal terminals extending vertically from the first printed circuit 3, while each of the second control connectors 13 can be made of a suitable port of the bottom-entry type, having three respective pairs of connection holes for inserting the metal terminals.

Usefully, each pair of metal terminals and of respective connection holes is used to transmit the same control signal between the first electronic board 2 and the second electronic board 10.

This permits introducing a redundancy of each control signal, and considerably improving the reliability and precision of the device 1.

This is particularly useful, e.g., in the case of automotive applications of the device 1, when the occurrence of vibrations can cause disturbances in the control signals.

Advantageously, the second printed circuit 11 comprises a plurality of through openings 14 and each of the first power connectors 7 on the first electronic board 2 has an elongated shape and extends upwards through a respective through opening 14.

The device 1 also has a third electronic board 15 comprising a third printed circuit 16 and a plurality of wound and power components 17 connected together on the third printed circuit 16 to define an electronic power circuit.

In particular, the third electronic board 15 has a plurality of second power connectors 18 connected to the extremities of respective first power connectors 7.

Consequently, each of the first power connectors 7 has an elongated shape and extends from the first electronic board 2 as far as the respective second power connector 18 on the third electronic board 15, through a respective through opening 14 obtained on the second electronic board 10.

Usefully, with reference to the preferred embodiment shown in the illustrations, each first power connector 7 is composed of a metal blade of elongated shape extending from the first printed circuit 3 of the first electronic board 2, while each second power connector 18 is composed of a port of the bottom-entry type having a housing for the free extremity of the metal blade.

In particular, the second power connector 18 can be composed of a female connector of the "faston" type turned upwards, extending from the upper face of the third printed circuit 16, and which is suitable for accommodating the extremity of the metal blade 18 from below, through a suitable opening made on the third electronic board 15.

Usefully, each of the second power connectors 18 has two pairs of contacts separate from one another and suitable for allowing the doubling of the power signal which, therefore, comes from the first electronic board 2 and is shown doubled on the second electronic board 10.

This permits introducing a redundancy of each power signal, considerably improving the reliability and the precision of the device 1.

This is particularly useful, e.g., in case of automotive applications of the device 1, when the vibrations occurred can cause disturbances on the power signals.

Usefully, the profile of each through opening 14 substantially reproduces the substantially flat and widened profile of the transversal section of the metal blade 7.

Usefully, the second electronic board 10 can have third control connectors 19, connected to corresponding fourth control connectors 20 on the third electronic board 15.

In particular, in the same way as the first and the second control connectors 6 and 13, each third control connector 19 can be composed, e.g., of three pairs of metal terminals extending vertically from the second printed circuit 11, while each of the fourth control connectors 20 can be made of a suitable port of the bottom-entry type, having three respective pairs of connection holes for inserting the metal terminals.

Advantageously, the device 1 can comprise one or more guide elements 21 fixed to the second electronic board 10 and/or to the third electronic board 15 and guide means 22 fixed to the first electronic board 2, wherein the guide elements 21 can be coupled sliding to guide means 22 during the assembly to favour the positioning of the second electronic board 10 and/or the third electronic board 15.

Figure 1:
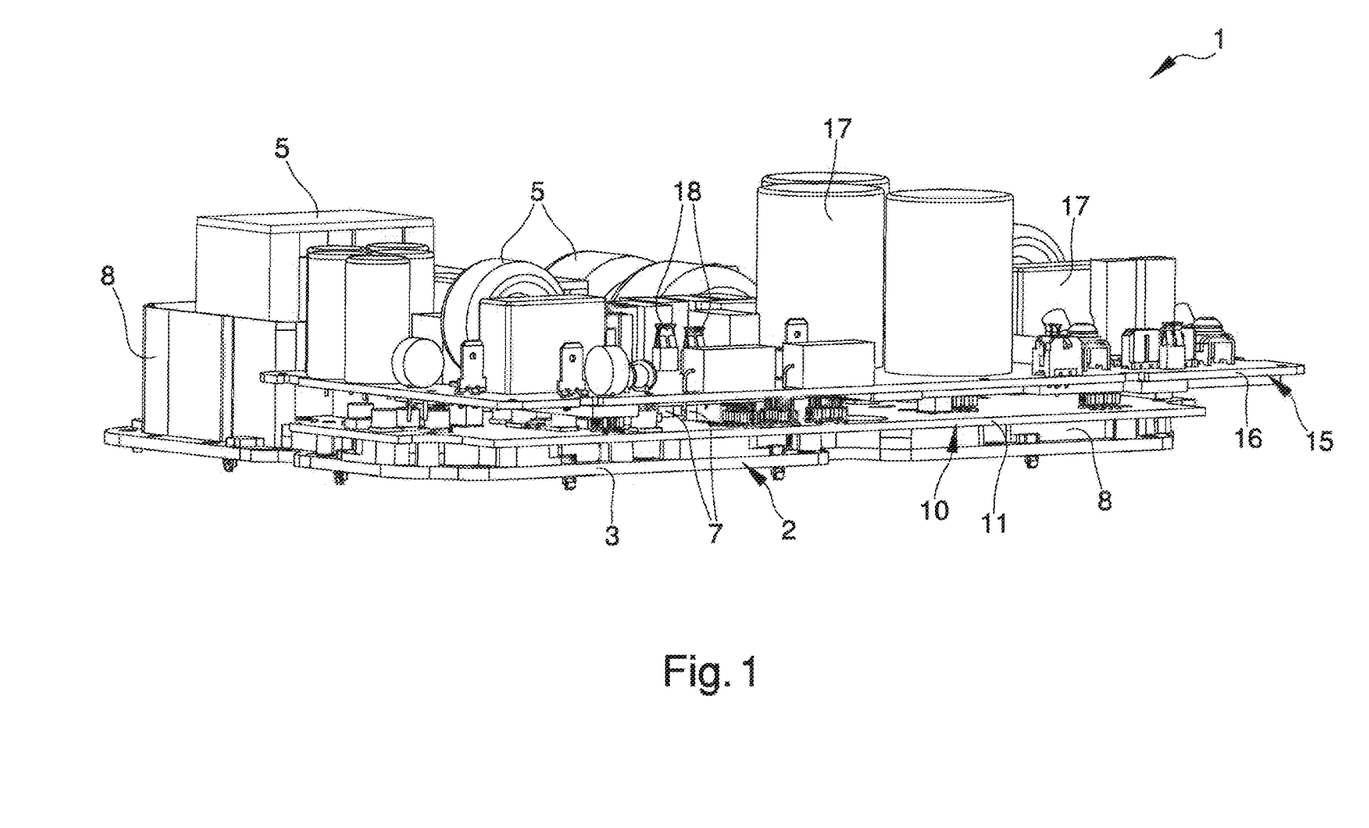
FIG. 1 is an axonometric view which shows an electronic device according to the invention.
Figure 2:
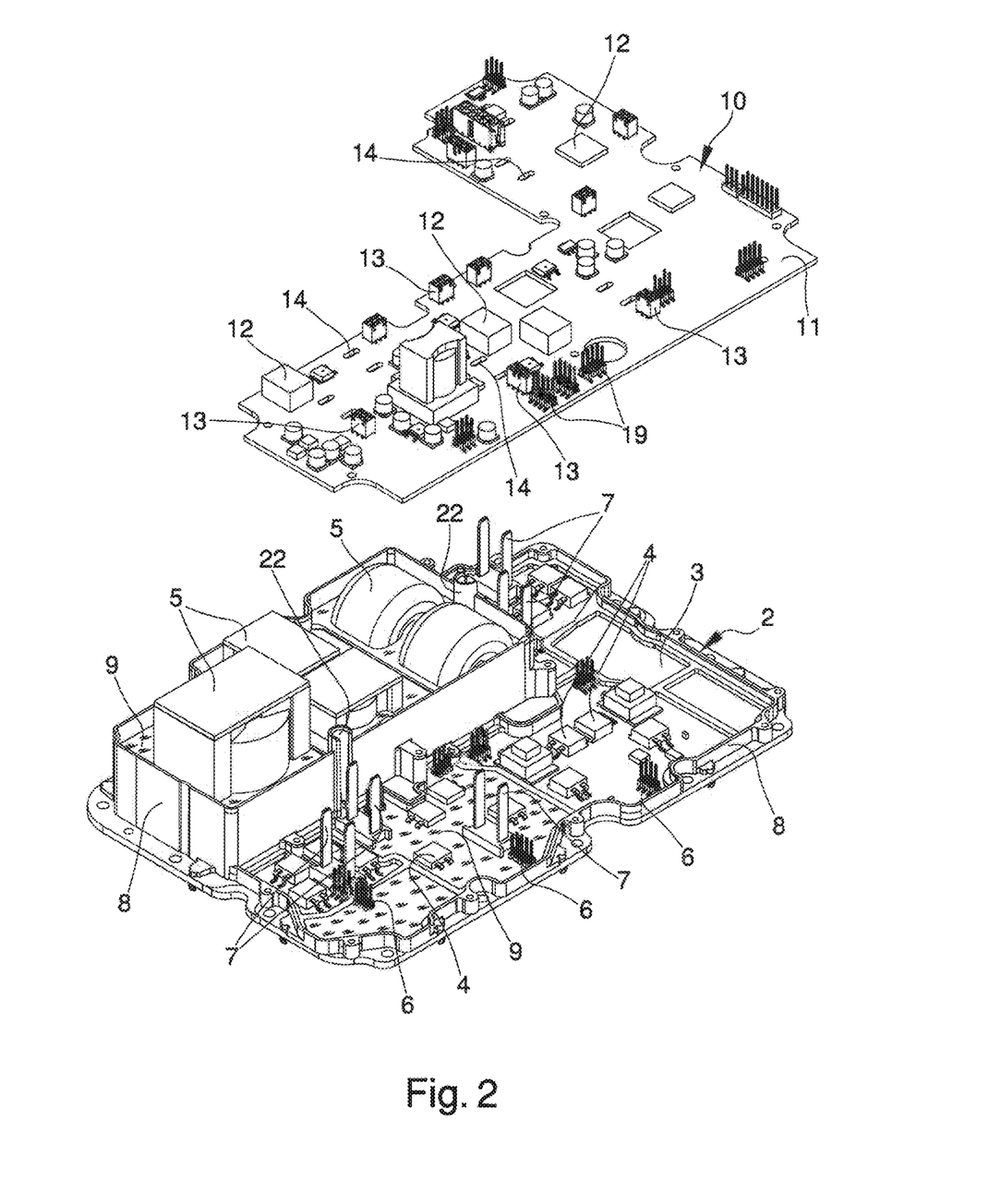
FIGS. 2 to 6 are axonometric views which show the procedure according to the invention.
Figure 3:
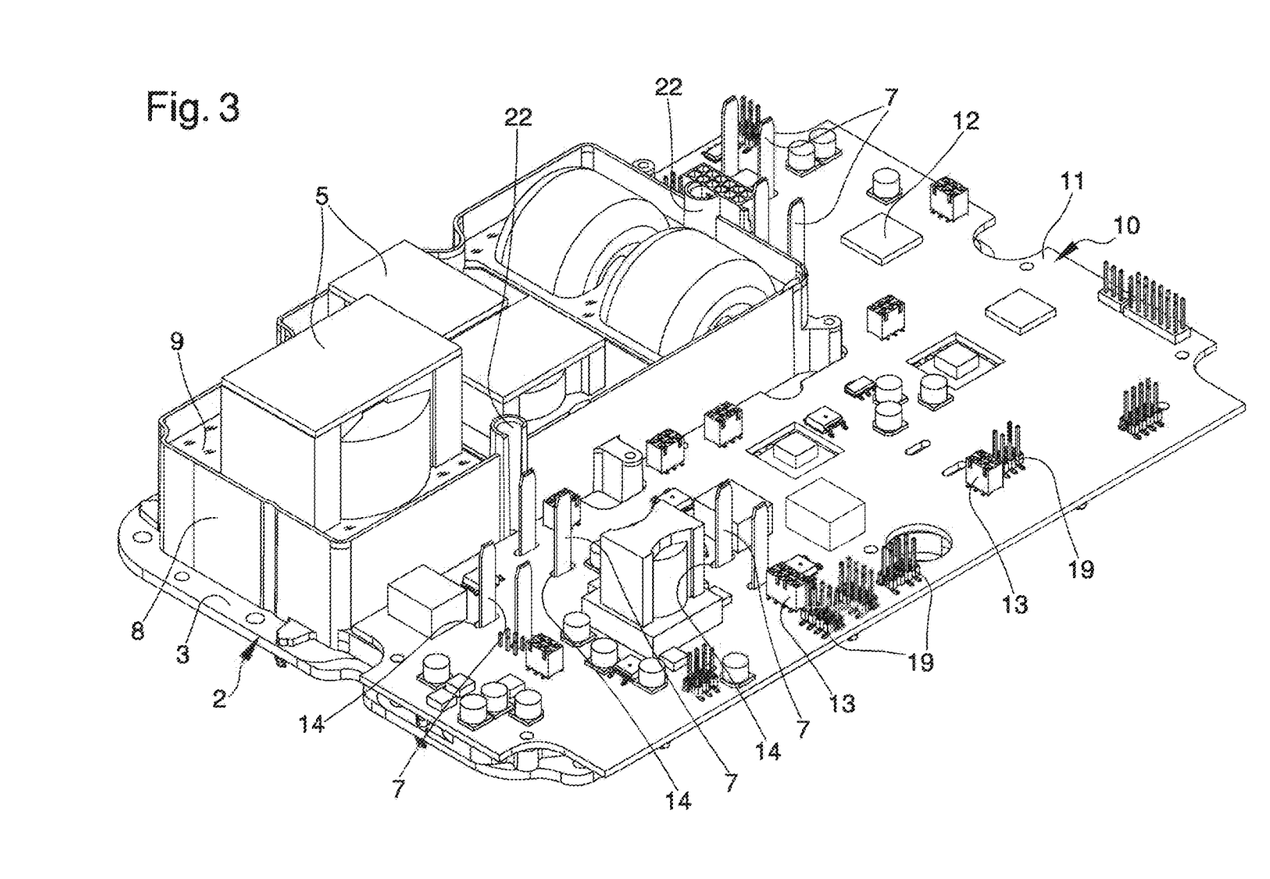
Figure 4:
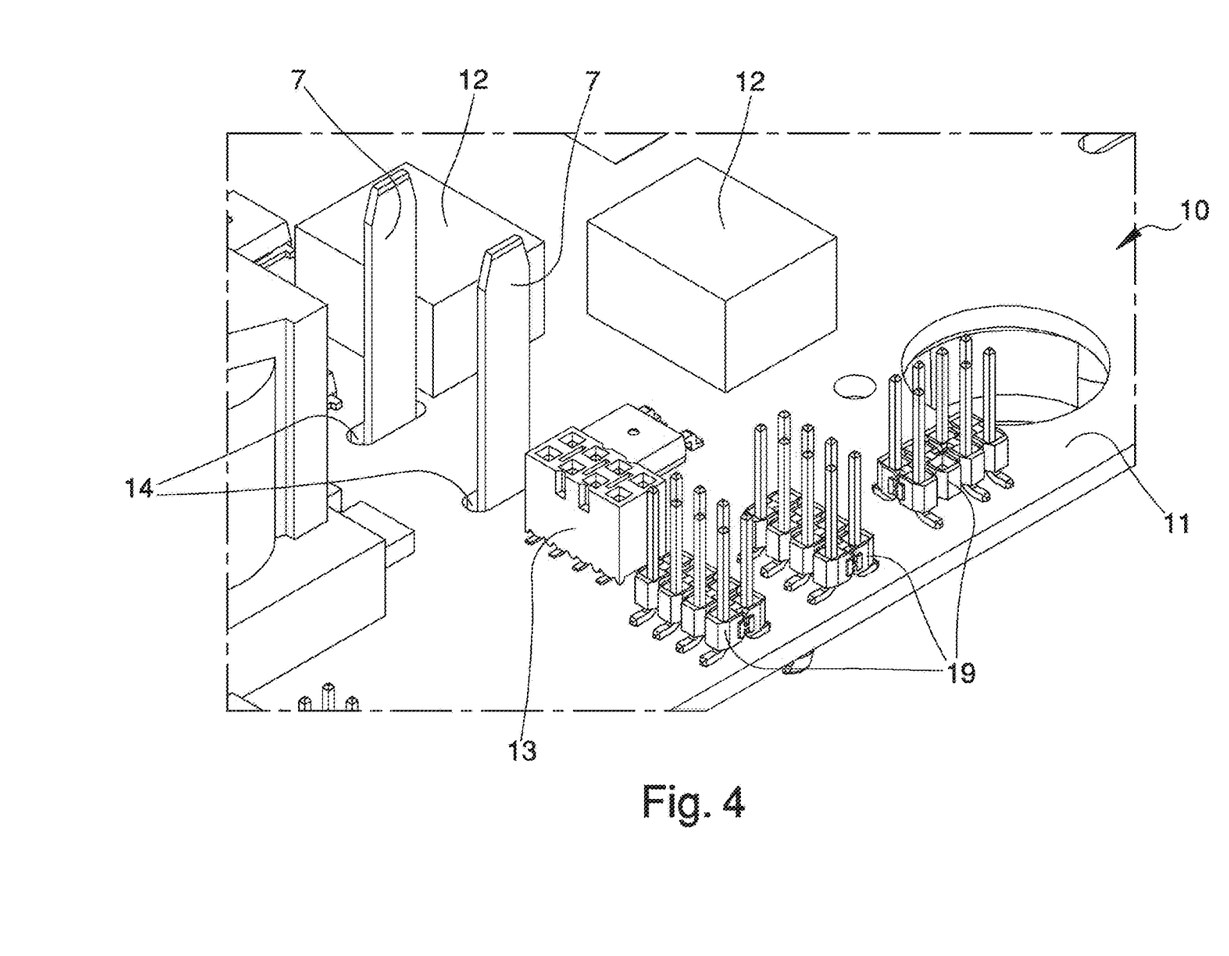
Figure 5:
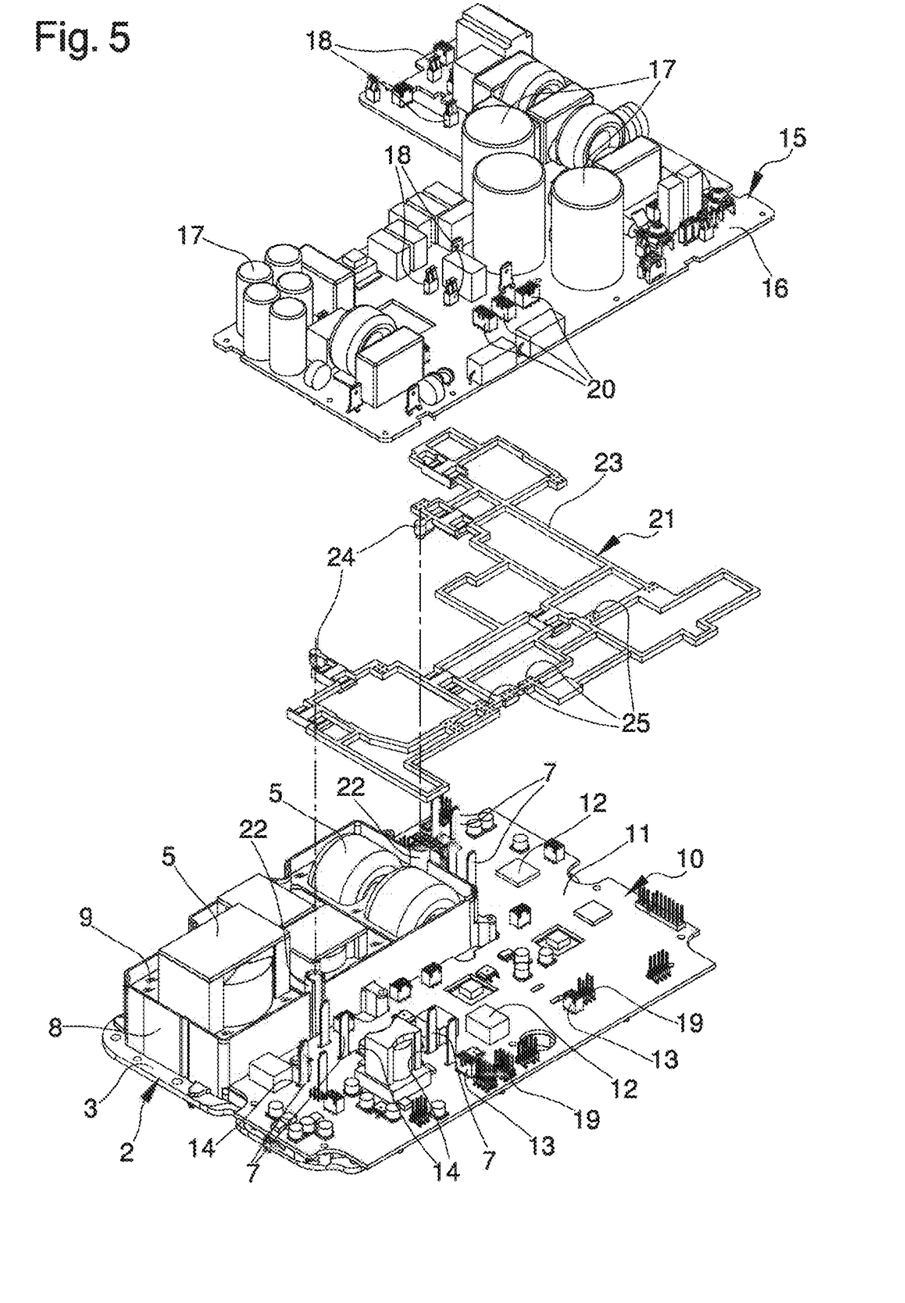
Figure 6:
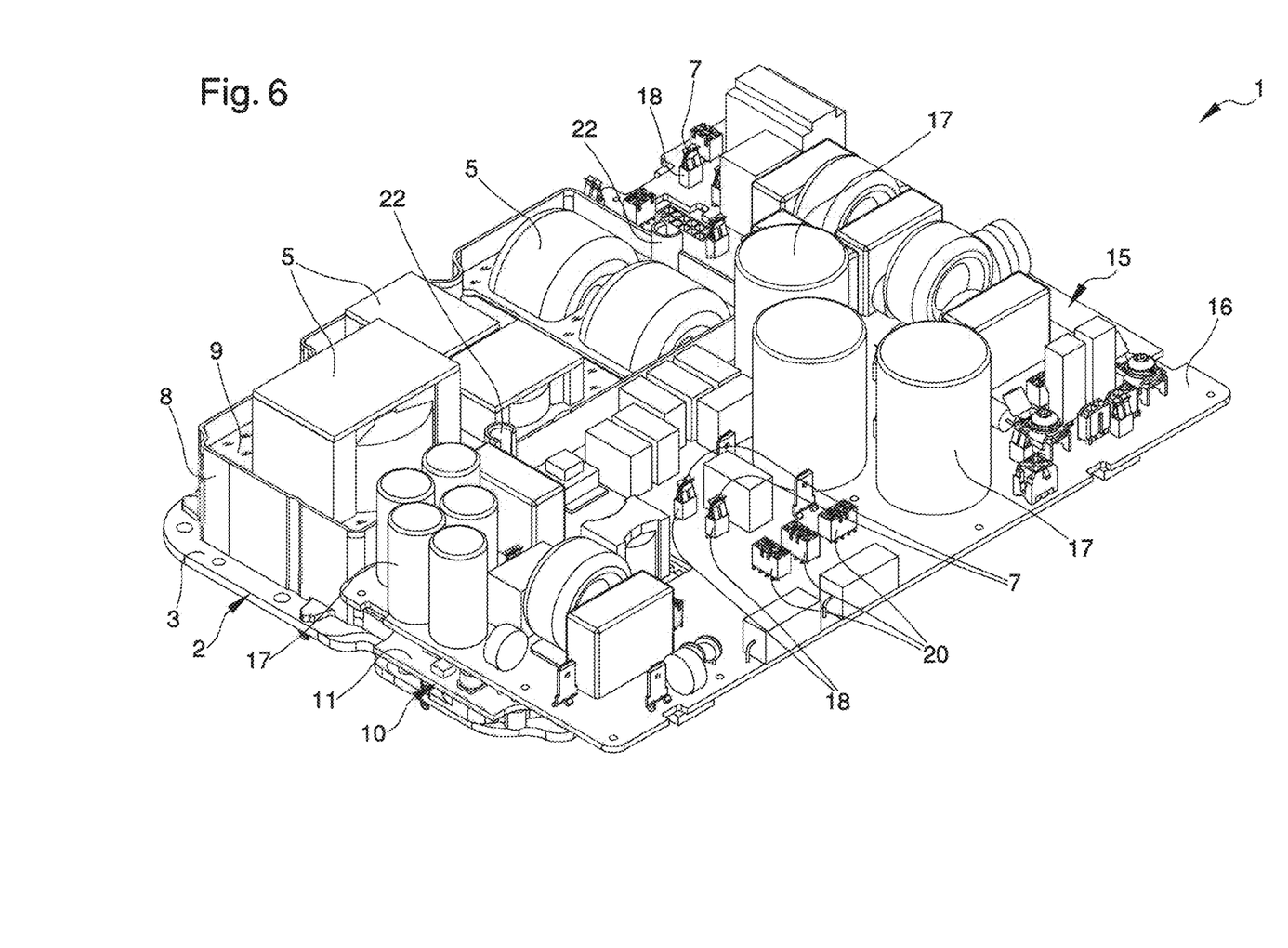

By way of example only, the FIG. 5 shows a particular embodiment wherein a guide element 21 is made up of a specific basket which, after assembly, is fixed to the lower portion of the third electronic board 15.

Always according to such embodiment, the guide means 22 are composed of suitable vertical rectilinear guides obtained directly in correspondence to sections of the walls of the template 8.

The guide element 21 has a suitable small frame 23 associable with the lower face of the third electronic board 15 and suitable protruding elements 24 insertable and sliding inside the rectilinear guides 22 during the positioning and the assembly of the third electronic board 15.

Usefully, in correspondence to the third control connectors 19, the guide element 21 has perforated portions 25 suitable for allowing the metal terminals to pass through and for guiding their insertion.

The procedure according to the invention comprises the following steps:
arranging the first electronic board 2 having first control connectors 6 and first power connectors 7 of substantially elongated shape;
arranging the second electronic board 10 comprising the control circuit, having the second control connectors 13 which can be connected to the first control connectors 6 and having the through openings 14;
arranging the third electronic board 15 comprising the power circuit and having second power connectors 18 which can be connected to the first power connectors 7;
associating the second electronic board 10 with the first electronic board 2, connecting the second control connectors 13 to the first control connectors 6 and inserting the first power connectors 7 through the respective through openings 14;
associating the third electronic board 15 with the second electronic board 10, connecting the second power connectors 18 to the first power connectors 7.

In particular, the connection between the first control connectors 6 and the second control connectors 13 consists in the insertion of the metal terminals of the first control connectors 6 inside the respective connection holes of the second control connectors 13.

Furthermore, the connection between the first power connectors 7 and the second power connectors 18 consists in the insertion of the free extremities of the metal blades of the first power connectors 7 into the respective connection housings of the second power connectors 18.

Usefully, the procedure envisages the integral association of the guide element 21 with the lower portion of the third electronic board 15 and the integral association of the rectilinear guide means 22 with the first electronic board 2.

Consequently, the above step of associating the third electronic board 15 with the second electronic board 10 envisages the coupling and sliding of the protruding elements 24 of the guide element 21 inside the rectilinear guides 22.

Usefully, the procedure according to the invention can comprise the further steps of:
depositing the thermo-hardening material 9 onto a portion of the first electronic board 2, in correspondence to one or more first control connectors 6 and/or to one or more first power connectors 7;
solidifying the thermo-hardening material 9 for locking the first control connectors 6 and/or the first power connectors 7 onto the first electronic board 2.

It has in practice been ascertained how the described invention achieves the proposed objects.

In particular, the fact is underlined that the presence of the particular power connectors and of the relative through openings made on the second electronic board allows considerably simplifying and speeding up the assembly and electrical connection of the electronic boards.

In fact, in a way different to the state of the art, it is no longer necessary to make the electrical connection of two boards not adjacent to one another by means of connectors fixed along respective perimeter portions of the electronic boards, connected to one another by means of a series of specific external cables.

This, furthermore, permits considerably reducing errors during the assembly and electronic connection procedures of the electronic boards.

In fact, all that needs doing is to insert the electronic boards the one on the other to make, in an extremely simple and fast way, the electronic connection of all the connectors.

Furthermore, the particular configuration of the power connectors, and therefore, the absence of specific side connectors connected the one to the other by means of wires, permits considerably reducing the overall dimensions of the electronic boards and, therefore, of the manufactured electronic device.

The invention claimed is:

1. A procedure for the manufacture and assembly of battery chargers for vehicles, comprising the following steps:
arranging at least a first electronic board of a battery charger, the first electronic board having at least a first power connector of substantially elongated shape;
arranging at least a second electronic board of the battery charger, the second electronic board having at least a through opening suitable for allowing a passage of said first power connector;
arranging at least a third electronic board of the battery charger, the third electronic board comprising at least a power circuit and a second power connector connectable to said first power connector;
arranging on said first electronic board at least a first control connector;

arranging on said second electronic board at least a control circuit and at least a second control connector connectable to said first control connector;

associating said second electronic board with said first electronic board, wherein said step of associating comprises inserting said first power connector through said through opening, and connecting said second control connector to said first control connector;

associating said third electronic board with said second electronic board, wherein said step of associating comprises connecting said second power connector to said first power connector;

depositing a thermo-hardening material onto at least one portion of said first electronic board in correspondence to at least one of said first control connector and said first power connector; and solidifying said thermo-hardening material for locking said at least one of said first control connector and said first power connector onto said first electronic board, wherein said first control connector comprises at least two metal terminals and said second control connector comprises at least two connection holes, said two terminals being suitable for transmitting one same control signal from said first electronic board to said second electronic board.

2. The procedure according to claim 1, wherein said at least two metal terminals of said first control connector extend from said first electronic board, and wherein said step of connecting said second control connector to said first control connector comprises inserting said metal terminals into said connection holes.

3. The procedure according to claim 1, wherein said first power connector comprises at least one metal blade of elongated shape that extends from said first electronic board and said second power connector comprises a bottom-entry port with at least one housing for the connection of said metal blade, and wherein said step of connecting said second power connector to said first power connector comprises inserting said metal blade into said connection housing.

4. The procedure according to claim 1, wherein the profile of said through opening substantially reproduces a profile of a transversal section of said first power connector.

5. The procedure according to claim 1, further comprising:

integrally associating at least one guide element (21) with at least one between said second electronic board and said third electronic board and integrally associating rectilinear guide means (22) with said first electronic board, and wherein said step of associating said second electronic board with said first electronic board and/or said step of associating said third electronic board with said second electronic board comprise the steps of coupling and sliding said guide element (21) on said rectilinear guide means (22).

* * * * *